(12) United States Patent
He et al.

(10) Patent No.: US 11,075,339 B2
(45) Date of Patent: Jul. 27, 2021

(54) CORRELATED ELECTRON MATERIAL (CEM) DEVICES WITH CONTACT REGION SIDEWALL INSULATION

(71) Applicant: Cerfe Labs, Inc., Austin, TX (US)

(72) Inventors: Ming He, San Jose, CA (US); Paul Raymond Besser, Sunnyvale, CA (US); Jingyan Zhang, Santa Clara, CA (US); Manuj Rathor, Fremont, CA (US)

(73) Assignee: Cerfe Labs, Inc., Austin, TX (US)

( * ) Notice: Subject to any disclaimer, the term of this patent is extended or adjusted under 35 U.S.C. 154(b) by 51 days.

(21) Appl. No.: 16/163,246

(22) Filed: Oct. 17, 2018

(65) Prior Publication Data

US 2020/0127200 A1    Apr. 23, 2020

(51) Int. Cl.
*H01L 45/00* (2006.01)

(52) U.S. Cl.
CPC ........ *H01L 45/1675* (2013.01); *H01L 45/085* (2013.01); *H01L 45/1233* (2013.01); *H01L 45/1246* (2013.01); *H01L 45/1253* (2013.01); *H01L 45/145* (2013.01); *H01L 45/146* (2013.01); *H01L 45/147* (2013.01)

(58) Field of Classification Search
CPC ....... H01L 45/145–147; H01L 45/1675; H01L 45/1233; H01L 45/1246; H01L 45/1253; H01L 45/085
USPC ............................... 257/4; 365/148; 438/104
See application file for complete search history.

(56) References Cited

U.S. PATENT DOCUMENTS

| | | | |
|---|---|---|---|
| 7,298,640 B2 | 11/2007 | Chen et al. | |
| 7,400,006 B1 | 7/2008 | Rinerson et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,373,149 B2 | 2/2013 | Takahashi | |
| 8,482,953 B2 | 7/2013 | Noshiro | |
| 8,618,526 B2 | 12/2013 | Sorada et al. | |
| 9,070,876 B2 | 6/2015 | Ito | |
| 9,159,917 B2 | 10/2015 | Yoneda | |
| 9,214,628 B2 | 12/2015 | Himeno et al. | |

(Continued)

FOREIGN PATENT DOCUMENTS

| | | |
|---|---|---|
| WO | 2009114796 A1 | 9/2009 |
| WO | 2009140305 A1 | 11/2009 |

(Continued)

OTHER PUBLICATIONS

Notification of Transmittal of the International Search Report and the Written Opinion of the International Searching Authority, or the Declaration, App. No. PCT/GB2019/053257 Filed Nov. 15, 2019, dated Jan. 27, 2020, 1 Page.

(Continued)

*Primary Examiner* — David Vu
*Assistant Examiner* — Brandon C Fox
(74) *Attorney, Agent, or Firm* — Berkeley Law & Technology Group, LLP

(57) ABSTRACT

Subject matter disclosed herein may relate to fabrication of a correlated electron material (CEM) switch. In particular embodiments, an insulative material may be formed on or over a sidewall portion of a conductive contact region. The insulative material may insulate the conductive contact region from resputtered CEM occurring during a physical etch of a CEM film.

14 Claims, 8 Drawing Sheets

(56) References Cited

U.S. PATENT DOCUMENTS

| | | | |
|---|---|---|---|
| 9,406,877 | B2 | 8/2016 | Tada et al. |
| 9,627,615 | B1 | 4/2017 | Reid et al. |
| 9,653,682 | B1 | 5/2017 | Chou et al. |
| 9,859,335 | B1* | 1/2018 | Hsu .................... H01L 27/2463 |
| 9,997,702 | B2 | 6/2018 | Reid et al. |
| 10,002,665 | B1 | 6/2018 | Bhargava et al. |
| 10,003,022 | B2* | 6/2018 | Liu .................... H01L 45/1675 |
| 10,014,468 | B2 | 7/2018 | Paz De Araujo et al. |
| 10,141,504 | B2 | 11/2018 | Shifren et al. |
| 2006/0019485 | A1 | 1/2006 | Komai et al. |
| 2008/0106925 | A1 | 5/2008 | Paz De Araujo et al. |
| 2008/0107801 | A1 | 5/2008 | Celinska et al. |
| 2009/0090899 | A1 | 4/2009 | Lim et al. |
| 2010/0038661 | A1 | 2/2010 | Nakagawa |
| 2010/0176363 | A1 | 7/2010 | Takahashi et al. |
| 2010/0327248 | A1* | 12/2010 | Khoueir .................. H01L 43/12 257/2 |
| 2011/0006278 | A1 | 1/2011 | Takahashi |
| 2013/0112935 | A1 | 5/2013 | Himeno et al. |
| 2013/0285699 | A1 | 10/2013 | McWilliams et al. |
| 2014/0097396 | A1 | 4/2014 | Murase et al. |
| 2014/0131654 | A1 | 5/2014 | Tu et al. |
| 2014/0197368 | A1* | 7/2014 | Yoneda .................. H01L 45/08 257/2 |
| 2014/0252295 | A1* | 9/2014 | Liao .................... H01L 27/2463 257/2 |
| 2015/0243708 | A1 | 8/2015 | Ravasio et al. |
| 2016/0163978 | A1 | 6/2016 | Paz De Araujo et al. |
| 2016/0268505 | A1 | 9/2016 | Sung et al. |
| 2017/0213960 | A1 | 7/2017 | Paz De Araujo et al. |
| 2017/0237001 | A1 | 8/2017 | Reid et al. |
| 2017/0301859 | A1 | 10/2017 | Paz De Araujo et al. |
| 2017/0317143 | A1 | 11/2017 | Chen et al. |
| 2018/0013062 | A1 | 1/2018 | Reid et al. |
| 2018/0019394 | A1 | 1/2018 | Reid et al. |
| 2018/0047897 | A1 | 2/2018 | Reid et al. |
| 2018/0047900 | A1 | 2/2018 | Reid et al. |
| 2018/0053892 | A1 | 2/2018 | Reid et al. |
| 2018/0096713 | A1 | 4/2018 | Chandra et al. |
| 2018/0159028 | A1 | 6/2018 | Shifren et al. |
| 2018/0159029 | A1 | 6/2018 | Paz De Araujo et al. |
| 2018/0159031 | A1 | 6/2018 | Paz De Araujo et al. |
| 2018/0175290 | A1 | 6/2018 | Reid et al. |
| 2018/0212146 | A1 | 7/2018 | Shifren et al. |
| 2019/0288202 | A1 | 9/2019 | Yoo |

FOREIGN PATENT DOCUMENTS

| | | | |
|---|---|---|---|
| WO | 2017160233 | A1 | 9/2017 |
| WO | 2017222525 | A1 | 12/2017 |

OTHER PUBLICATIONS

International Search Report, App. No. PCT/GB2019/053257 Filed Nov. 15, 2019, dated Jan. 27, 2020, 5 Pages.
Written Opinion of the International Searching Authority, App. No. PCT/GB2019/053257 Filed Nov. 15, 2019, dated Jan. 27, 2020, 12 Pages.
Notification of Transmittal of the International Search Report and the Written Opinion of the International Searching Authority, or the Declaration, App. No. PCT/GB2019/050559, dated Jun. 11, 2019, 1 Page.
International Search Report, App. No. PCT/GB2019/050559, dated Jun. 11, 2019, 6 Pages.
Written Opinion of the International Searching Authority, App. No. PCT/GB2019/050559, 17 Pages.
Notification of Transmittal of the International Search Report and Written Opinion of the International Searching Authority, or the Declaration, App. No. PCT/GB2019/050562, dated Jun. 17, 2019, 1 Page.
International Search Report, App. No. PCT/GB2019/050562, dated Jun. 17, 2019, 6 Pages.
Written Opinion, App. No. PCT/GB2019/050562, dated Jun. 17, 2019, 13 Pages.
Notification of Transmittal of the International Search Report and the Written Opinion of the International Searching Authority, or the Declaration, App. No. PCT/GB2019/050479, Filed Feb. 21, 2019, dated Oct. 22, 2019, 1 Page.
International Search Report, App. No. PCT/GB2019/050479, Filed Feb. 21, 2019, dated Oct. 22, 2019, 6 Pages.
Written Opinion of the International Searching Authority, App. No. PCT/GB2019/050479, Filed Feb. 21, 2019, dated Oct. 22, 2019, 10 Pages.
Office Action, U.S. Appl. No. 15/933,818, dated Mar. 8, 2019, 13 Pages.
Response to Office Action, U.S. Appl. No. 15/933,813, filed Jun. 10, 2019, 22 Pages.
Second Office Action, U.S. Appl. No. 15/933,818, dated Jun. 18, 2019, 14 Pages.
Response to Second Office Action, U.S. Appl. No. 15/933,818, filed Sep. 17, 2019, 12 Pages.
Third Office Action, U.S. Appl. No. 15/933,818, dated Nov. 1, 2019, 80 Pages.
Response to Third Office Action, U.S. Appl. No. 15/933,818, filed Apr. 1, 2020, 20 Pages.
Final Office Action, U.S. Appl. No. 15/933,818, dated Apr. 16, 2020, 7 Pages.
Response to Final Office Action, U.S. Appl. No. 15/933,818, filed Jun. 16, 2020, 11 Pages.
Notification of Transmittal of the International Search Report and the Written Opinion of the International Searching Authority, or Declaration, App. No. PCT/GB2019/052948, dated Jan. 3, 2020, 1 Page.
International Search Report, App. No. PCT/GB2019/052948, dated Jan. 3, 2020, 5 Pages.
Written Opinion of the International Searching Authority, App. No. PCT/GB2019/052948, dated Jan. 3, 2020, 9 Pages.
Restriction Requirement, U.S. Appl. No. 16/271,377, dated Oct. 2, 2019, 8 pages.
Response to Restriction Requirement, U.S. Appl. No. 16/271,377, Filed Nov. 27, 2019, 11 Pages.
Office Action, U.S. Appl. No. 16/271,377, dated Jan. 17, 2020, 25 Pages.
Response to Office Action, U.S. Appl. No. 16/271,377, Filed Apr. 17, 2020, 23 Pages.
Final Office Action, U.S. Appl. No. 16/271,377, dated Jun. 17, 2020, 17 Pages.
Response to Final Office Action, U.S. Appl. No. 16/271,377, Filed Sep. 11, 2020, 16 Pages.
Advisory Action, U.S. Appl. No. 16/271,377, dated Sep. 21, 2020, 16 Pages.
RCE/Amendment, U.S. Appl. No. 16/271,377, Filed Oct. 8, 2020, 18 Pages.
Office Action, U.S. Appl. No. 16/271,377, dated Mar. 29, 2021, 7 Pages.
Response to Office Action, U.S. Appl. No. 16/271,377, Filed May 5, 2021, 12 Pages.
Office Action, U.S. Appl. No. 16/748,555, dated Mar. 9, 2021, 18 Pages.

* cited by examiner

400

405
Etch a portion of a conductive overlay formed over a correlated electron material (CEM) film to expose a portion of the CEM film and to form a sidewall region of a remaining portion of the conductive overlay 410
Form an insulative layer on the sidewall region 415
Remove an exposed portion of the CEM film while maintaining a portion of the CEM film disposed under the conductive overlay intact

505
Form a conductive contact region over a first portion of a film of correlated electron material (CEM) while maintaining an exposed second portion of the film of CEM, the contact region having at least one sidewall 510
Form an insulative material on the at least one sidewall, the insulative material to insulate the conductive contact region from resputtered CEM occurring during a physical etching process of the CEM film

*FIG. 5*

CORRELATED ELECTRON MATERIAL (CEM) DEVICES WITH CONTACT REGION SIDEWALL INSULATION

BACKGROUND

Field

This disclosure relates to devices formed from correlated electron material (CEM), and may relate, more particularly, to approaches for fabricating CEM devices, such as may be used in switches, memory circuits, and so forth, which may exhibit desirable impedance switching characteristics.

Information

Integrated circuit devices, such as electronic switching devices, for example, may be found in numerous types of electronic devices. For example, memory and/or logic devices may incorporate electronic switches suitable for use in computers, digital cameras, smart phones, computing devices, wearable electronic devices, and so forth. Factors that may relate to electronic switching devices, which may be of interest to a designer in considering whether an electronic switching device is suitable for particular applications, may include physical size, storage density, operating voltages, impedance ranges, switching speed, and/or power consumption, for example. Other factors may include, for example, cost and/or ease of manufacture, scalability, and/or reliability.

However, conventional fabrication techniques, which may be suitable for certain types of memory and/or logic devices, may not be suited for use in fabricating correlated electron material devices that exhibit desired switching capabilities and/or impedance properties.

SUMMARY

Briefly, particular implementations may be directed to a method of constructing a switching device. The method may comprise etching a portion of a conductive overlay formed over a correlated electron material (CEM) film to expose a portion of the CEM film and to form a sidewall region of a remaining portion of the conductive overlay. The method may continue with forming an insulative layer on the sidewall region, and removing an exposed portion of the CEM film while maintaining a portion of the CEM film disposed under the conductive overlay intact.

Another particular implementation may be directed to a method of constructing a switching device, comprising forming a conductive contact region over a first portion of a film of CEM while maintaining an exposed second portion of the film of CEM, the contact region having at least one sidewall. The method may further comprise forming an insulative material on the at least one sidewall, wherein the insulative material operates to insulate the conductive contact region from resputtered CEM occurring during a dry etch process of the CEM film.

Another particular implementation may be directed to a switching device comprising a first conductive film and a correlated electron material (CEM) film formed over a first portion of a surface, which may correspond to a top portion of the surface, of the first conductive film, while a second portion of the first conductive film is exposed. The switching device may additionally comprise a second conductive film disposed over the CEM film, the second conductive film having an exposed sidewall region. The switching device may additionally include an insulative material disposed on the sidewall region of the second conductive film, the insulative material being capable of maintaining separation of the second conductive film from resputtered CEM occurring responsive to application of an etch process to the CEM film.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 4-5 are flow diagrams illustrating processes of fabricating and/or constructing a CEM switching device having contact region sidewall insulation according to embodiments.

Figure 1A:
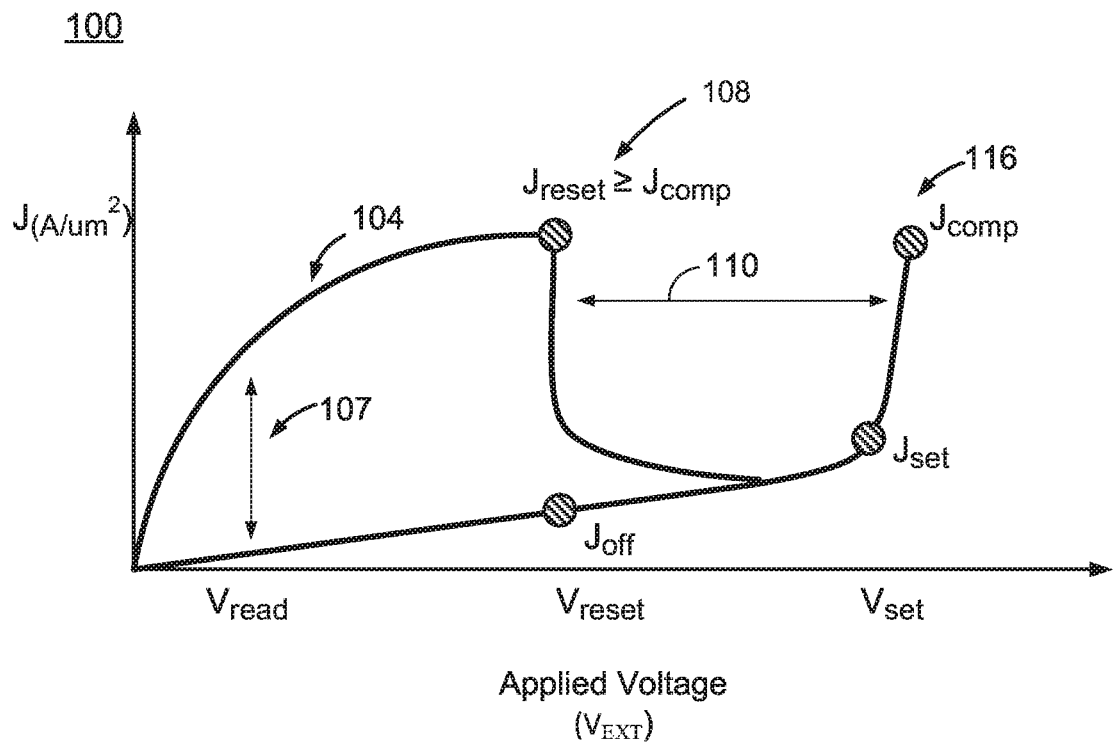
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like indicates that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductive-state-to-insulative-state, which may be enabled, at least in part, by electron correlations, which modify electrical properties of the material, rather than solid-state structural phase changes, such as in response to a change from a crystalline to an amorphous state, for example. Such solid-state structural phase changes, such as from crystalline to amorphous states, for example, may bring about formation of conductive filaments in certain resistive RAM devices. In one aspect, a substantially rapid conductor-to-insulator transition in a CEM device may be responsive to a quantum mechanical phenomenon that takes place within the bulk of a material, in contrast to melting/solidification or localized filament formation, for example, in phase change and certain resistive RAM devices. Such quantum mechanical transitions between relatively conductive and relatively insulative states, and/or between a first impedance state and a second, dissimilar impedance state, for example, in a CEM device may be understood in any one of several aspects. As used herein, the terms "relatively conductive state," "relatively lower impedance state," and/or "metal state" may be interchangeable, and/or may, at times, be referred to as a "relatively conductive/lower-impedance state." Likewise, the terms "relatively insulative state" and "relatively higher impedance state" may be used interchangeably herein, and/or may, at times, be referred to as a "relatively insulative/higher impedance state." Further, in a relatively insulative/higher-impedance state, a CEM may be characterized by a range of impedances, and, in a relatively conductive/lower-impedance state, a CEM may be characterized by a second range of impedances. In embodiments, the range of impedances may be significantly dissimilar to the second range of impedances.

In an aspect, a quantum mechanical transition of a CEM between a relatively insulative/higher impedance state and a relatively conductive/lower impedance state, wherein the relatively conductive/lower impedance state is substantially dissimilar from the insulative/higher impedance state, may be understood in terms of a Mott transition. In accordance with a Mott transition, a material may switch between a relatively insulative/higher impedance state to a relatively conductive/lower impedance state if a Mott transition condition occurs. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., a higher-impedance/insulative state) to a relatively lower resistance/lower capacitance state (e.g., a lower-impedance/conductive state) that is substantially dissimilar from the higher resistance/higher capacitance state.

In another aspect, the Mott transition may be controlled by a localization of electrons. If carriers, such as electrons, for example, are localized, a strong coulomb interaction between the carriers may split the bands of the CEM to bring about a relatively insulative (relatively higher impedance) state. If electrons are no longer localized, a weak coulomb interaction may dominate, which may give rise to a removal of band splitting. Responsive to such band splitting, a metal may transition from a relatively conductive state to a substantially dissimilar, insulative state.

Further, in an embodiment, switching from a relatively insulative/higher impedance state to a substantially dissimilar and relatively conductive/lower impedance state may enable a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and thus may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a substantial volume of a CEM switching a device's impedance state, such as in response to a Mott-transition. For example, in an embodiment, substantially all CEM of a device may switch between a relatively insulative/higher impedance state and a relatively conductive/lower impedance state (e.g., a "metal" or "metallic state") responsive to a Mott transition, or from a relatively conductive/lower impedance state to a relatively insulative/higher impedance state responsive to a reverse Mott transition.

In implementations, a CEM may comprise one or more "D block" elements or compounds of "D block" elements, which correspond to transition metals or transition metal oxides (TMOs). CEM devices may also be implemented utilizing one or more "F block" elements or compounds of "F block" elements. A CEM may comprise one or more rare earth elements, oxides of rare earth elements, oxides comprising one or more rare earth transition metals, perovskites, yttrium, and/or ytterbium, or any other compounds comprising metals from the lanthanide or actinide series of the periodic table of the elements, for example, and claimed subject matter is not limited in scope in this respect. A CEM may additionally comprise a dopant, such as a carbon-containing dopant and/or a nitrogen-containing dopant, wherein the atomic concentration (e.g., of carbon or nitrogen) comprise between about 0.1% to about 15.0%. As the term is used herein, a "D block" element means an element comprising scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. A CEM formed from or comprising an "F block" element of the periodic table of the elements means a CEM comprising a metal or metal oxide, wherein the metal is from the F block of the periodic table of the elements, which may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (CO, einsteinium (Es), fermium (Fm), mendelevium (Md), nobelium (No) or lawrencium (Lr), or any combination thereof.

FIG. 1A is an illustration of an embodiment 100 of a current density (J) versus an applied voltage ($V_{EXT}$) for a device formed from a CEM. At least partially in response to a voltage applied to terminals of a CEM device, for example, during a "write operation," the CEM device may be placed into a relatively low-impedance/conductive state or a relatively high-impedance/insulative state. For example, application of a voltage $V_{set}$ and a current density $J_{set}$ may enable a transition of the CEM device to a relatively low-impedance/conductive state. Conversely, application of a voltage $V_{reset}$ and a current density $J_{reset}$ may enable a transition of the CEM device to a relatively high-impedance/insulative state. As shown in FIG. 1A, reference designator 110 illustrates the voltage range that may separate $V_{set}$ from $V_{reset}$. Following placement of the CEM device into a high-impedance state/insulative or into a low-impedance/conductive state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any compound or material comprising a D block or F block element. In one aspect, the CEM device of FIG. 1A may comprise other types of TMO switching materials, though it should be understood that these are exemplary only and are not intended to limit claimed subject matter. Nickel oxide (NiO) is disclosed as one particular TMO material. NiO materials discussed herein may be doped with substitutional ligands, such as carbon-containing materials (e.g., carbonyl $(CO)_4$), or nitrogen-containing materials, such as ammonia ($NH_3$), for example, which may establish and/or stabilize material properties and/or enable a P-type operation in which a CEM may be more conductive when placed into a low-impedance/conductive state. Thus, in another particular example, NiO doped with substitutional ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound by balancing valences. Other dopant ligands, which may enable or increase conductivity in a low-impedance/conductive state in addition to carbonyl may include: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($Cl_{12}H_8N_2$), bipyridine ($C_{10}H_8N_2$), ethylenediamine ($C_2H_4$ $(NH_2)_2$), acetonitrile ($CH_3CN$), fluoride (F), chloride (Cl), bromide (Br), cyanide (CN), sulfur (S), carbon (C), and others.

In this context, a "P-type" doped CEM as referred to herein means a first type of CEM comprising a particular molecular dopant that exhibits increased electrical conductivity, relative to an undoped CEM, when the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In this context, a "P-type" doped CEM as referred to herein means a first type of CEM comprising a particular molecular dopant that exhibits increased electrical conductivity, relative to an undoped CEM, while the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In another embodiment, the CEM device represented by the current density versus voltage profile of FIG. 1A, may comprise other TMO materials, such as carbon-containing ligands or nitrogen-containing ligands, though it should be understood that these are exemplary only and are not intended to limit claimed subject matter. NiO, for example, may be doped with substitutional carbon- or nitrogen-containing ligands, which may stabilize switching properties in a manner similar to stabilization switching properties responsive to use of a carbon-containing dopant species (e.g., carbonyl). In particular, NiO materials disclosed herein may include nitrogen-containing molecules of the form $C_xH_yN_z$ (wherein x≥0, y≥0, z≥0, and wherein at least x, y, or z comprise values >0) such as ammonia ($NH_3$), cyano ($CN^-$), azide ion ($N_3^-$) ethylene diamine ($C_2H_8N_2$), phen(1, 10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO switching materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand.

In accordance with FIG. 1A, if sufficient bias voltage is applied (e.g., exceeding a band-splitting potential) and the aforementioned Mott condition is satisfied (e.g., injected electron holes are of a population comparable to a population of electrons in a switching region, for example), a CEM device may switch between a relatively low-impedance/conductive state to a relatively high-impedance/insulative state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance/insulative material. If the CEM device comprises a relatively high-impedance/insulative state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance/conductive state. In a low-impedance/conductive state, an increase in electrons may screen incoming electrons and remove a localization of electrons, which may operate to collapse the band-splitting potential, thereby giving rise to the low-impedance/conductive state.

In accordance with particular embodiments, current in a CEM device may be controlled by an externally applied "compliance" condition, which may be determined at least partially on the basis of an applied external current, which may be limited during a write operation, for example, to place the CEM device into a relatively high-impedance/insulative state. This externally applied compliance current may, in some embodiments, also set a condition of a current density for a subsequent reset operation to place the CEM device into a relatively high-impedance/insulative state. As shown in the particular implementation of FIG. 1A, a voltage $V_{set}$ may be applied during a write operation to give rise to a current density $J_{comp}$, such as at point 116, to place the CEM device into a relatively low-impedance/conductive state, which may determine a compliance condition for placing the CEM device into a relatively high-impedance/insulative state in a subsequent write operation. As shown in FIG. 1A, the CEM device may be subsequently placed into a low-impedance/conductive state by application of an externally applied voltage ($V_{reset}$), which may give rise to a current density $J_{reset} \geq J_{comp}$ at a voltage referenced by 108 in FIG. 1A.

In embodiments, compliance may set a number of electrons in a CEM device that may be "captured" by holes for the Mott transition. In other words, a current applied in a write operation to place a CEM device into a relatively low-impedance/conductive memory state may determine a number of holes to be injected to the CEM device for subsequently transitioning the CEM device to a relatively high-impedance/insulative state.

As pointed out above, a reset condition may occur in response to a Mott transition at point 108. As pointed out above, such a Mott transition may give rise to a condition in a CEM device in which a concentration of electrons n approximately equals, or becomes at least comparable to, a concentration of electron holes p. This condition may be modeled according to expression (1) as follows:

$$\lambda_{TF}n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott transition criterion for the low-impedance/conductive state to high-impedance/insulative state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

In expression (2), $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In expression (3), $A_{CEM}$ is a cross-sectional area of a CEM device; and make the italics) may represent a current density through the CEM device to be applied to the CEM device at a threshold voltage $V_{MI}$, which may place the CEM device into a relatively high-impedance/insulative state.

According to an embodiment, a CEM device, which may be utilized to form a CEM switch, a CERAM memory device, or a variety of other electronic devices comprising one or more correlated electron materials, may be placed into a relatively low-impedance/conductive memory state, such as by transitioning from a relatively high-impedance/insulative state, for example, via injection of a sufficient quantity of electrons to satisfy a Mott transition criteria. In transitioning a CEM device to a relatively low-impedance/conductive state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance/conductive state.

In particular embodiments, changes in impedance states of a CEM device, may be brought about by "back-donation" of electrons of compounds comprising $Ni_xO_y$ (wherein the subscripts "x" and "y" comprise whole numbers). As the term is used herein, "back-donation" refers to a supplying of one or more electrons (e.g., increased electron density) to a transition metal, transition metal oxide, or any combination thereof (e.g., to an atomic orbital of a metal), by an adjacent molecule of a lattice structure, such as a ligand or dopant. Back-donation also refers to reversible donation of electrons (e.g., an increase electron density) from a metal atom to an unoccupied n-antibonding orbital on a ligand or dopant. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbon-containing dopants, such as carbonyl $(CO)_4$, or a nitrogen-containing dopant species, such as ammonia $(NH_3)$, ethylene diamine $(C_2H_8N_2)$, or members of an oxynitride family $(Ni_xO_y)$, for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in a nickel oxide material (e.g., $NiO:CO$ or $NiO:NH_3$), thereby permitting the nickel oxide material to switch to exhibiting a substantially dissimilar impedance property, such as a high-impedance/insulative property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance/conductive properties if the transition metal, such as nickel, for example, is placed into an oxidation state of 2+(e.g., $Ni^{2+}$ in a material, such as $NiO:CO$ or $NiO:NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \qquad (4)$$

Such disproportionation, in this instance, refers to formation of nickel ions as $Ni^{1+} + Ni^{3+}$ as shown in expression (4), which may bring about, for example, a relatively high-impedance/insulative state during operation of the CEM device. In an embodiment, a dopant such as a carbon-containing ligand, carbonyl (CO) or a nitrogen-containing ligand, such as an ammonia molecule $(NH_3)$, may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance/conductive state.

In embodiments, depending on a molecular concentration of $NiO:CO$ or $NiO:NH_3$, for example, which may vary from values approximately in the range of an atomic percentage of about 0.1% to about 15.0%, $V_{reset}$ and $V_{set}$, as shown in FIG. 1A, may vary approximately in the range of about 0.1 V to about 10.0 V subject to the condition that $V_{set} \geq V_{reset}$. For example, in one possible embodiment, $V_{reset}$ may occur at a voltage approximately in the range of about 0.1 V to about 1.0 V, and $V_{set}$ may occur at a voltage approximately in the range of about 1.0 V to about 2.0 V, for example. It should be noted, however, that variations in $V_{set}$ and $V_{reset}$ may occur based, at least in part, on a variety of factors, such as atomic concentration of an electron back-donating material, such as $NiO:CO$ or $NiO:NH_3$ and other materials present in the CEM device, as well as other process variations, and claimed subject matter is not limited in this respect.

Figure 1B:
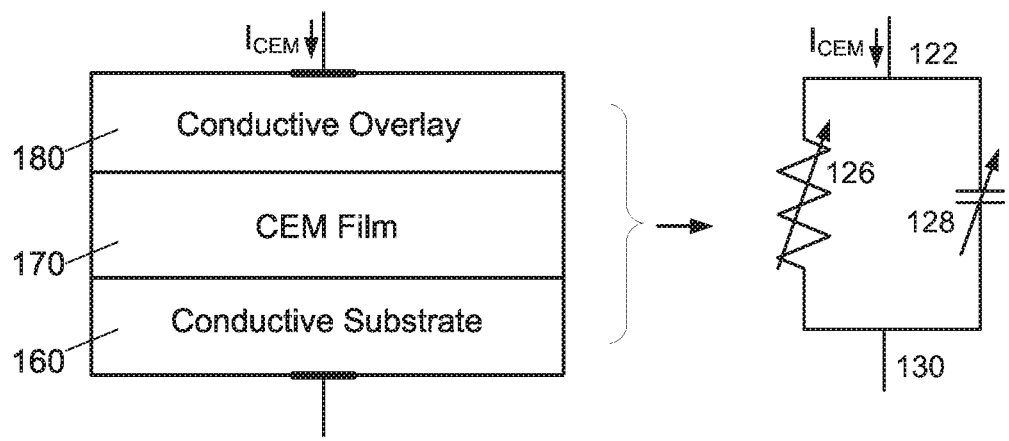
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising conductive substrate 160, CEM film 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM film and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 150, may transition between a low-impedance/conductive state and a substantially dissimilar, high-impedance/insulative state as a function at least partially dependent on a voltage applied across a CEM device. In an embodiment, an impedance exhibited at a low-impedance/conductive state may be approximately in the range of 10.0-100,000.0 times lower than an impedance exhibited in a high-impedance/insulative state. In other embodiments, an impedance exhibited at a low-impedance/conductive state may be approximately in the range of 5.0 to 10.0 times lower than an impedance exhibited in a high-impedance/insulative state, for example. It should be noted, however, that claimed subject matter is not limited to any particular impedance ratios between high-impedance/insulative states and low-impedance/conductive states. Table 1 shows that a capacitance of a variable impedance device, such as the device of embodiment 150, may transition between a lower capacitance state, which, in an example embodiment, may comprise approximately zero (or negligible) capacitance, and a higher capacitance state that is a function, at least in part, of a voltage applied across a CEM device.

In certain embodiments, atomic layer deposition may be utilized to form or to fabricate films comprising NiO materials, such as NiO:CO or NiO:NH$_3$. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness dimension comparable to that of a single atom, which may comprise, for example, a fraction of an angstrom (e.g., 0.6 Å). However, in other embodiments, a layer may encompass a sheet or coating comprising a thickness dimension greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance/conductive state. During operation in a circuit environment, for example, electron back-donation may be reversed so as to give rise to a substantially dissimilar impedance state, such as a high-impedance/insulative state, for example.

In this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, conductive substrate 160 may operate to convey an electrical current to a CEM film in contact with conductive substrate 160. A conductive substrate, such as conductive substrate 160, for example, may comprise a titanium-based and/or titanium-containing substrate, such as titanium nitride (TiN), fabricated in layers, for example, for use in a CEM switch other type of CEM-based device. In other embodiments, conductive substrate 160 may comprise other types of conductive materials, such as titanium nitride, platinum, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive substrate material.

In embodiments, in which conductive substrate 160 comprises titanium nitride, for example, substrate 160 may be formed utilizing precursors such as titanium tetrachloride (TiCl$_4$), which may comprise chlorine as a potential dopant species as the chlorine atoms diffuse into a CEM. In another embodiment, a TiN substrate may be formed utilizing tetrakis dimethylamido titanium (TDMAT), tetrakis diethylamido titanium (TDEAT), and/or titanium isopropoxide (TTIP), which may comprise carbon as a dopant species as carbon atoms diffuse into the CEM. It should be noted that titanium-based and/or titanium-containing precursor materials may comprise dopant species in addition to chlorine and/or carbon and claimed subject matter is not limited in this respect. Precursors may be used with nitrogen (e.g., co-flow) as a dopant species in the form of NH$_3$.

In other embodiments, conductive substrate 160 may comprise a tantalum-based and/or a tantalum-containing material, such as tantalum nitride (TaN), formed in layers, for use in a CERAM device or other type of CEM-based device. In embodiments, a TaN substrate may be formed utilizing precursors such as pentakisdimethylamido tantalum (PDMAT), which may comprise carbon as a dopant species. In another embodiment, a TaN substrate may be formed utilizing tantalum ethoxide (TAETO), which may also comprise carbon as a dopant species. In another embodiment, a TaN substrate may be formed utilizing tantalum pentachloride (TaCl$_5$), which may comprise chlorine as a dopant species. It should be noted that tantalum-based and/or tantalum-containing precursor materials may comprise dopant species in addition to chlorine and/or carbon and claimed subject matter is not limited in this respect. Precursors may be used with nitrogen (e.g., co-flow) as a dopant species in the form of NH$_3$.

In other embodiments, conductive substrate 160 may comprise a tungsten-based and/or a tungsten-containing material formed in layers, such as tungsten-nitride (WN), for example, for use in a CERAM device or other type of CEM-based device. In embodiments, a WN substrate may be formed utilizing precursors such as tungsten hexacarbonyl (W(CO)$_6$) and/or cyclopentadienyltungsten(II) tricarbonyl hydride, both of which may comprise carbon as a dopant species. In another embodiment, a WN substrate may be formed utilizing triamminetungsten tricarbonyl ((NH$_3$)3W (CO)$_3$) and/or tungsten pentacarbonyl methylbutylisonitrile (W(CO)5(C$_5$H$_{11}$NC), both of which may comprise carbon or nitrogen as a dopant species. It should be noted that tungsten-based and/or tungsten precursor materials may comprise dopant species in addition to nitrogen and/or carbon and claimed subject matter is not limited in this respect. Precursors may be used with nitrogen (e.g., co-flow) as a dopant species in the form of NH$_3$.

In another example, a substrate may operate to insulate a CEM film to prohibit electrical current flow to or from the CEM film. In one possible example of an insulating substrate, a material such as silicon nitride (SiN) may be employed to insulate components of semiconductor structures. Further, an insulating substrate may comprise other silicon-based materials such as silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal back end, and/or other semiconductor structures and/or technologies, including CEM devices, for example. Accordingly, claimed subject matter is intended to embrace a wide variety of conductive and insulating substrates without limitation.

In particular embodiments, formation of CEM films on or over a substrate may utilize two or more precursors to deposit components of, for example, NiO:CO or NiO:NH$_3$, or other transition metal oxide, transition metal, or combination thereof, onto a conductive material such as a substrate. In an embodiment, layers of a CEM film may be deposited utilizing separate precursor molecules, AX and BY, according to expression (6A), below:

$$AX_{(gas)} + BY_{(gas)} = AB_{(solid)} + XY_{(gas)} \quad (6A)$$

Wherein "A" of expression (6A) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6A) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)2 where dmamp=1-dimethylamino-2-methyl-2-propanolate, Bis (pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni (CH$_3$C$_5$H$_4$)$_2$, Nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni (C$_5$(CH$_3$)$_5$)$_2$, and nickel carbonyl (Ni(CO)$_4$), just to name a few examples.

However, in particular embodiments, a dopant operating as an electron back-donating species in addition to precursors AX and BY may be utilized to form layers of a TMO film. An electron back-donating species, which may co-flow with precursor AX, may permit formation of electron back-donating compounds, substantially in accordance with expression (6B), below. In embodiments, a dopant species or a precursor to a dopant species, such as carbonyl (CO)$_4$, ammonia (NH$_3$), methane (CH$_4$), carbon monoxide (CO), or other precursors and/or dopant species may be utilized to provide electron back-donating ligands listed above. Thus, expression (6A) may be modified to include an additional dopant ligand comprising an electron back-donating material substantially in accordance with expression (6B), below:

$$AX_{(gas)} + (NH_3 \text{ or other ligand comprising nitrogen}) + BY_{(gas)} = AB:NH_{3(solid)} + XY_{(gas)} \quad (6B)$$

It should be noted that concentrations, such as atomic concentrations, of precursors, such as AX, BY, and NH$_3$ (or other ligand comprising nitrogen) of expressions (6A) and (6B) may be adjusted to give rise to a final atomic concentration of nitrogen-containing or carbon-containing dopant to permit electron back-donation in a fabricated CEM device. As referred to herein, the term "dopant atomic concentration" means the concentration of atoms in the finished material that derive from the substitutional ligand. For example, in the case in which the substitutional ligand is CO, the atomic concentration of CO in percentage terms comprises the total number of carbon atoms that comprise the material film divided by the total number of atoms in the material film, multiplied by 100.0. In another example, for the case in which the substitutional ligand is NH$_3$, the atomic concentration of NH$_3$ comprises the total number of nitrogen atoms that comprise the material film divided by the total number of atoms in the material film, multiplied by 100.0.

In particular embodiments, nitrogen- or carbon-containing dopants may comprise ammonia (NH$_3$), carbon monoxide (CO), or carbonyl (CO)$_4$ in an atomic concentration of between about 0.1% and about 15.0%. In particular embodiments, atomic concentrations of dopants, such as NH$_3$ and CO, may comprise a more limited range of atomic concentrations such as, for example, between about 1.0% and about 15.0%. However, claimed subject matter is not necessarily limited to the above-identified precursors and/or atomic concentrations. It should be noted that claimed subject matter is intended to embrace all such precursors and atomic concentrations of dopants utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. In expressions (6A) and (6B), "BY" may comprise an oxidizer, such as water (H$_2$O), oxygen (O$_2$), ozone (O$_3$), plasma O$_2$, hydrogen peroxide (H$_2$O$_2$). In other embodiments, "BY" may comprise CO, O$_2$+(CH$_4$), or nitric oxide (NO)+water (H$_2$O) or an oxynitride or carbon-containing a gaseous oxidizing or oxynitridizing agent. In other embodiments, plasma may be used with an oxidizer (BY) to form oxygen radicals (O*). Likewise, plasma may be used with a dopant species to form an activated species to control dopant concentration in a CEM.

In particular embodiments, such as embodiments utilizing atomic layer deposition, a substrate, such as conductive substrate 160, may be exposed to precursors, such as AX and BY of expression (6B), as well as dopants providing electron back-donation (such as ammonia or other ligands comprising metal-nitrogen bonds, including, for example, nickel-amides, nickel-imides, nickel-amidinates, or combinations thereof) in a heated chamber, which may attain, for example, a temperature of approximately in the range of 20.0° C. to 1000.0° C., for example, or between temperatures approximately in the range of 20.0° C. and 500.0° C. in certain embodiments. In one particular embodiment, in which atomic layer deposition of NiO:NH$_3$, for example, is performed, chamber temperature ranges approximately in the range of 20.0° C. and 400.0° C. may be utilized. Responsive to exposure to precursor gases (e.g., AX, BY, NH$_3$, or other ligand comprising nitrogen), such gases may be purged from the heated chamber for durations approximately in the range of 0.5 seconds to 180.0 seconds, for example. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression (6A) or a single three-precursor cycle (e.g., AX, NH$_3$, CH$_4$, or other ligand comprising nitrogen, carbon, or other electron back-donating dopant derived from an substitutional ligand and BY, as described with reference to expression (6B) utilizing atomic layer deposition may bring about a layer of a TMO material film comprising a thickness dimension approximately in the range of 0.6 Å to 5.0 Å per cycle). Accordingly, in one embodiment, if an atomic layer deposition process is capable of depositing layers of a TMO material film comprising a thickness dimension of approximately 0.6 Å, 800-900 two-precursor cycles may be utilized to bring about a TMO material film comprising a thickness dimension of approximately 500.0 Å. It should be noted that atomic layer deposition may be utilized to form TMO material films having other thickness dimensions, such as thickness dimensions approximately in the range of about 15.0 Å to about 1500.0 Å, for example, and claimed subject matter is not limited in this respect.

In particular embodiments, responsive to one or more two-precursor cycles (e.g., AX and BY), or three-precursor cycles (AX, NH$_3$, CH$_4$, or other ligand comprising nitrogen, carbon or other back-donating dopant material and BY), of atomic layer deposition, a TMO material film may be exposed to elevated temperatures, which may, at least in part, enable formation of a CEM device from a TMO material film. Exposure of the TMO material film to an elevated temperature may additionally enable activation of a back-donating dopant derived from a substitutional ligand, such as in the form of carbon monoxide, carbonyl, or ammonia, responsive to repositioning of the dopant to metal oxide lattice structures of the CEM device film.

Thus, in this context, an "elevated temperature" means a temperature at which substitutional or substitutional ligands evaporate from a TMO material film, and/or are repositioned within a TMO material film, to such an extent that the TMO material film transitions from a resistive film to a film that is capable of switching between a relatively high-impedance/insulative state to a relatively low-impedance/conductive state. For example, in certain embodiments, a TMO material film exposed to an elevated temperature within a chamber of about 100.0° C. to about 800.0° C. for a duration of about 30.0 seconds to about 120.0 minutes may permit evaporation of substitutional ligands from the TMO material film so as to form a CEM film. Additionally, in certain embodiments, a TMO material film exposed to an elevated temperature within a chamber of about 100.0° C. to about 800.0° C. for a duration of about 30.0 seconds to about 120.0 minutes may permit repositioning of substitutional ligands, for example, at oxygen vacancies within a lattice structure of a metal oxide. In particular embodiments, elevated temperatures and exposure durations may comprise more narrow ranges, such as, for example, temperatures of about 200.0° C. to about 500.0° C. for about 1.0 minute to about 60.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, V$_{reset}$ may occur at a voltage approximately in the range of about 0.1 V to about 1.0 V, and V$_{set}$ may occur at a voltage approximately in the range of about 1.0 V to about 2.0 V, for example. Accordingly, electrical switching voltages operating in a range of about 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In particular embodiments, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacent to first and second CEM devices, respectively.

In a further embodiment, one or more of a plurality of CEM devices may be positioned within two or more levels of an integrated circuit at one or more intersections of electrically conductive metal layers of a first level and electrically conductive metal layers of a second level, which may be positioned over the first level of conductive metal layers. In this context a "metal layer" as the term is used herein, means a conductor that routes an electrical current from a first location to a second location of a layer of a multi-level CEM switching device. For example, a conductive metal layer may transport electrical current to or from an access device located at an intersection of a conductive metal layer of first level and a conductive metal layer of the second level. In certain embodiments, fabrication of a switching device formed from a multi-level CEM device, such as devices formed utilizing conductive metal layers positioned at multiple levels of a CEM switching device may be utilized in CEM-based memory devices in which conductive metal layer positioned at multiple levels may facilitate an increase in bit line density, for example. Increases in bit line density may bring about more efficient and/or more highly integrated approaches toward controlling access to memory cells of CEM-based random access memory arrays, for example.

Additionally, in this context, a "level" as the term is used herein, means a discrete surface, which a conductive metal layer may traverse, wherein the discrete surface is separated from discrete surfaces immediately above and/or immediately below, by an insulating material. For example, as described herein, a conductive metal layer traversing a first level may be separated from a conductive metal layer traversing a second level by an insulating material, such as silicon nitride. In this context, a "multi-level" switching device, as the term is used herein, means a device to perform a switching function, such as from a high-impedance/insulative state to a low-impedance state, utilizing two or more of the above-described "levels."

As described herein, responsive to depositing one or more dopant layers on or over one or more layers of a first material, such as a transition metal, a transition metal oxide, a transition metal compound or alloy, dopant concentration of a CEM may be accurately controlled. Additionally, by depositing one or more dopant layers on or over one or more layers of a first material, localized regions of CEM may comprise differing atomic concentrations of dopants so as to provide an approach toward tailoring or customizing a dopant concentration profile. Further, dopant concentration profiles within a CEM may be increased via adjusting annealing temperatures and/or annealing durations. In addition to the above-identified advantages, particular embodiments may provide an approach toward fabricating or forming a common source electrode, which may be useful in fabricating three-dimensional structures utilized for NAND flash memory. However, claimed subject matter is not limited to the above-identified advantages.

Figure 2A:
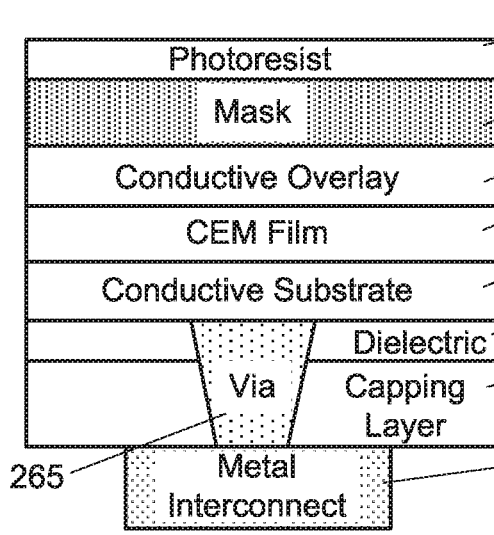
FIGS. 2A-2F illustrate embodiments of sub-processes, which may be utilized to form a correlated electron material device.

FIGS. 2A-2F illustrate embodiments of sub-processes, which may be utilized to form a CEM device. In particular environments, the sub-processes of FIGS. 2A-2F may be performed during back-end-of-line integrated circuit fabrication processes, although in certain embodiments, one or more of the sub-processes of FIGS. 2A-2F may be performed during other stages of a circuit fabrication process, and claimed subject matter is not limited in this respect. In FIG. 2A, which corresponds to embodiment 200, metal interconnect 250, which may comprise copper or aluminum, for example, having a thickness of between about 5.0 nm and about 50.0 nm, for example, may be deposited on or over an appropriate substrate. In one particular embodiment, metal interconnect layer 250 may comprise a level of a multilevel integrated circuit wafer fabricated during one or more previous fabrication processes. Thus, in a particular embodiment, metal interconnect layer 250 may comprise one or more first layers of a fourth metal interconnect level (M4) of a wafer fabricated over a previously fabricated third metal interconnect level (M3) of a wafer.

In particular embodiments, following formation of metal interconnect layer 250, capping layer 260 may be formed over metal interconnect layer 250, which may operate to restrict, or to preclude entirely, diffusion and/or migration of copper ions, for example, into the dielectric layer 270 embodiment 200. Capping layer 260 may additionally operate to reduce or preclude moisture from entering the metal interconnect layer 250 in embodiment 200. Capping layer 260 may comprise a material such as silicon nitride, silicon carbon nitride or aluminum nitride, or any combination thereof, and claimed subject matter is not limited to any particular type of capping material. In particular embodiments, capping layer 260 may comprise a thickness of between about 0.5 nm and about 20.0 nm, for example, although claimed subject matter is intended to embrace capping layers comprising a variety of thicknesses, virtually without limitation.

In embodiment 200, dielectric layer 270 may be deposited on or over capping layer 260. In certain embodiments, dielectric layer 270 may comprise a thickness of between about 1.0 nm and about 50.0 nm, just as an example. In particular embodiments, dielectric layer 270 may comprise a material such as a fluorosilicate glass having a relatively low relative dielectric constant, such as between about 3.0 and about 4.2, for example. However, in other embodiments, dielectric layer 270 may comprise a different material, such as a material comprising a dielectric layer of between 2.0 and 5.0, for example. It should be noted, however, that claimed subject matter is intended to embrace dielectric layers comprising relative dielectric constants of less than about 2.5, for example, as well as relative dielectric constants greater than about 5.0, for example, and claimed subject matter is not limited in this respect. Dielectric layer 270 may operate to reduce capacitive coupling, such as between metal interconnect 250 and conductive substrate 160, for example, as well as performing additional functions, and claimed subject matter is not limited in this respect.

After formation of dielectric layer 270 and capping layer 260 on or over metal interconnect 250, via 265 may be etched into dielectric and capping layers 270 and 260. In particular embodiments, via 265 may be etched by utilizing a suitable etching process, such as reactive ion etching, sputter etching, just as examples. After completion of an etching process, via 265 may be filled with a suitable material such as tungsten, for example, which may provide an electrically conductive path between metal interconnect 250 and, for example, conductive substrate 160. It should be noted, however, that via 265 may comprise a conductive material other than tungsten, and claimed subject matter is not limited in this respect.

In embodiment 200, conductive substrate 160, CEM film 170, and conductive overlay 180 may be formed, as described with reference to FIG. 1B herein conductive substrate 160 may be formed on or over dielectric layer 270 and/or via 265 utilizing a suitable deposition process such as, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. It should be noted, however, that conductive substrate 160, CEM film 170, and conductive overlay 180 may be formed utilizing any other process, and claimed subject matter is not intended to be limited in this respect. In a non-limiting embodiment, conductive substrate 160 and conductive overlay 180 may comprise iridium, platinum, ruthenium, or rhodium, just to name a few candidate materials, having thicknesses of between about 1.0 nm and about 100.0 nm, for example. Also in a non-limiting embodiment, CEM film 170, which may comprise a thickness of between about 1.0 nm and about 100.0 nm, for example, may comprise NiO utilizing a CO dopant having a concentration of between about 0.1% and about 20.0%, for example.

Upon completion of the formation of conductive overlay 180, hardmask 280 may be deposited on or over conductive overlay 180, followed by photoresist layer 290 deposited on or over hardmask 280. In embodiment 200, hardmask 280 may comprise an oxide hardmask material such as a silicon dioxide, for example, although claimed subject matter is intended to embrace use of any hardmask material, virtually without limitation. Photoresist layer 290 may comprise any material suitable for use with a photolithographic process to form patterns in hardmask 280, for example.

Figure 2B:
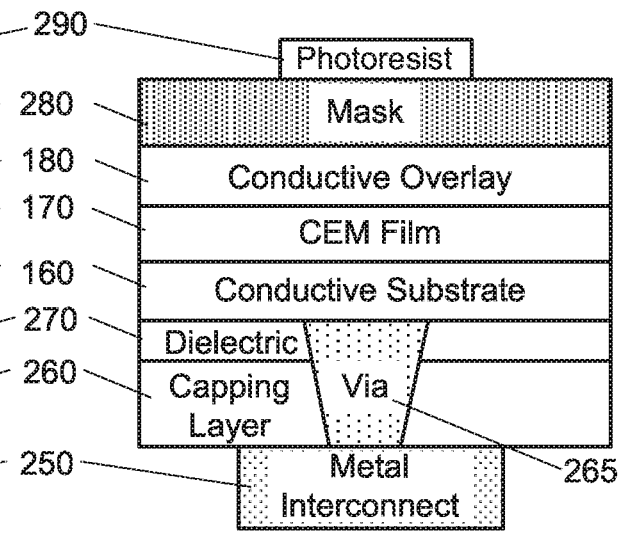
Figure 2C:
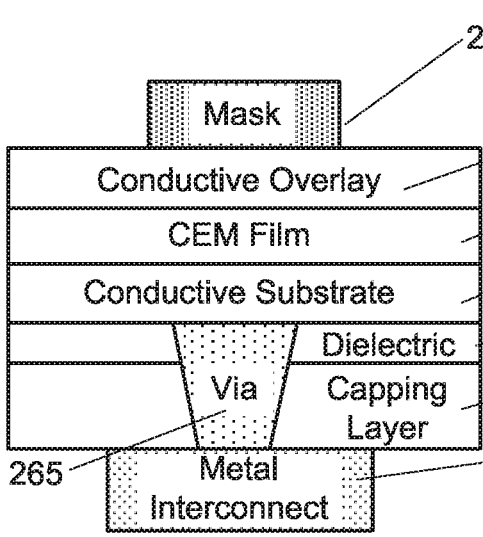
Figure 2D:
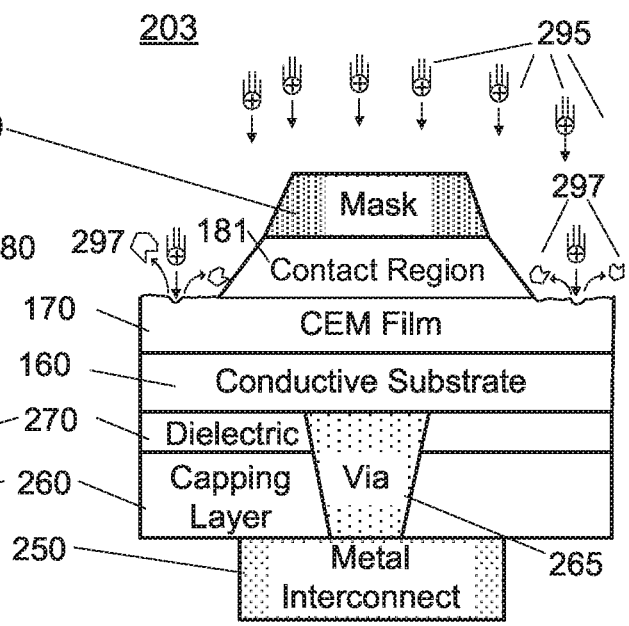

In FIG. 2B (embodiment 201), photoresist layer 290 has been patterned so as to expose portions of hardmask 280 to a physical or chemical etchant. In FIG. 2C (embodiment 202), photoresist layer 290 has been removed, such as by way of a suitable solvent or other material, which may strip photoresist layer 290 from hardmask 280. In FIG. 2D (embodiment 203) hardmask 280 conductive overlay 180, CEM film 170, and conductive substrate 160 may be exposed to dry etch 295 which may occur in an etching chamber. At least partially in response to the nonvolatile nature of the etch byproduct from conductive overlay 180, CEM film and conductive substrate, dry etch 295 may involve use of an anisotropic etching process in which an ion beam may be directed towards conductive overlay 180, CEM film 170, and/or conductive substrate 160. In particular embodiments, such anisotropic etching may operate to bombard one or more of conductive overlay 180, CEM film 170, and conductive substrate 160 with high-energy ions, which collide with atoms and/or molecules of overlay 180, film 170, and/or substrate 160. Responsive to such collisions, particles, such as individual atoms and/or molecules, may be vaporized and removed from the etching chamber.

Thus, contact region 181 may be formed from conductive overlay 180 responsive to dry etch 295. However, at least in particular embodiments, dry etch 295 may give rise to a sloped profile of contact region 181, CEM film 170, and conductive substrate 160. Thus, in particular embodiments, dry etch 295 may bring about resputtered metallic droplets 297, which may comprise nonvolatile particles of metal and/or metal oxides, for example, dislodged from conductive overlay 180, CEM film 170, and/or conductive substrate 160.

Figure 2E:
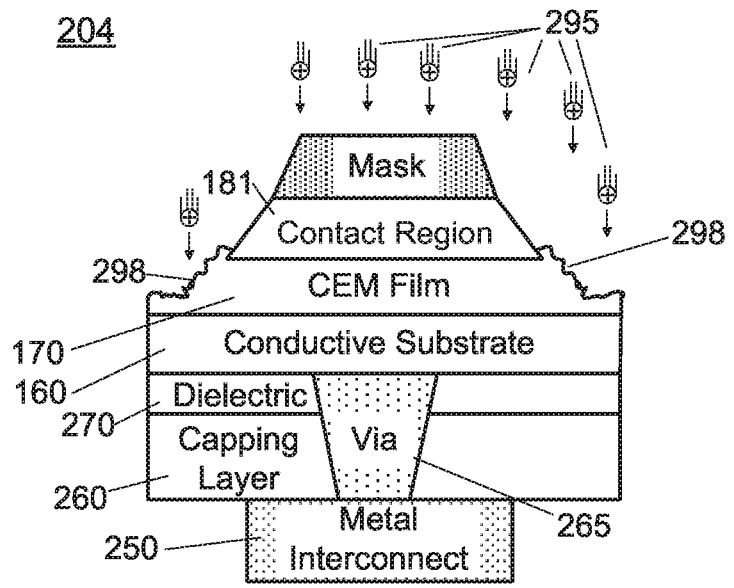
Figure 2F:
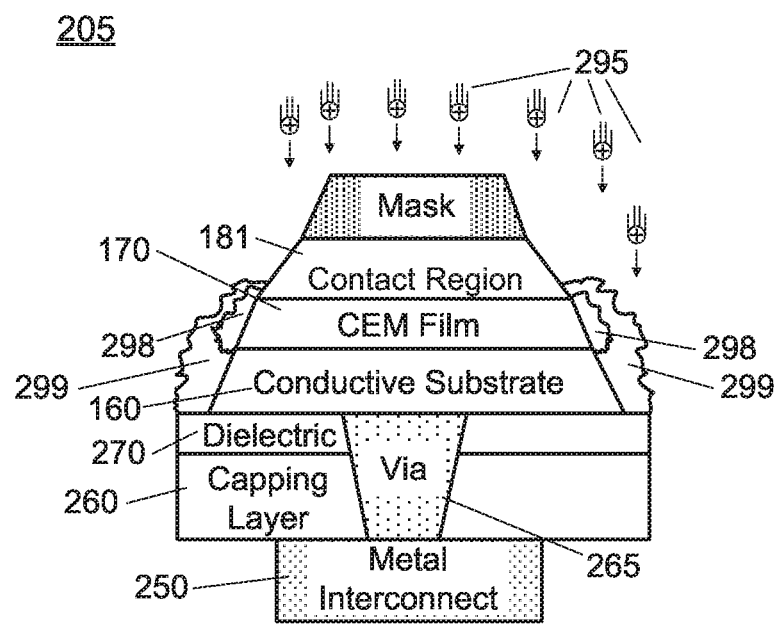

As shown in FIG. 2E, as dry etch 295 removes portions of CEM film 170, resputtered droplets may accumulate to form resputter accumulation layer 298, which may accumulate at sidewalls of contact region 181. In particular embodiments, resputter accumulation layer 298, which may be formed from resputtered metallic droplets 297 (of FIG. 2D), may comprise a thickness of, for example, between approximately 1.0 nm and approximately 5.0 nm, as shown in FIG. 2F. In certain embodiments, resputter accumulation layer 298 may be sufficient to alter electrical (e.g., switching) properties of a device formed utilizing the processes of FIG. 2A-2F. Such alteration in electrical properties of a device may also comprise increases in parasitic capacitance, which may be brought about via trapping of charges within resputter accumulation layer 298, as well as changes in resistivity, for example, of contact region 181.

Following dry etch 295 of conductive overlay 180 to form contact region 181, as well as formation of resputter accumulation layer 298, dry etch process 295 may proceed with etching of conductive substrate 160. In particular embodiments, similar to formation of resputter accumulation layer 298, dry etch process 295 may give rise to formation of resputter accumulation layer 299, which may be formed from unvaporized metallic particles of conductive substrate 160.

In particular embodiments, formation of resputter accumulation layer 299 may comprise a significant concentration of metallic components of conductive substrate 160. Accordingly, in one example, for which conductive substrate 160 comprises iridium-based material, resputter accumulation layer 299 may comprise a significant atomic concentration of iridium metal. In another example, for which conductive substrate 160 comprises a tantalum-based material, resputter accumulation layer 299 may comprise a significant atomic concentration of tantalum. Thus, in certain embodiments, resputter accumulation layer 299 may comprise a significant metallic component which may operate to conduct an electrical current between contact region 181 and conductive substrate 160, as shown in FIG. 2F. Thus, at least in certain embodiments, responsive to application of a voltage between contact region 181 and conductive substrate 160, at least a portion of electrical current, may be directed (or "shorted") through resputter accumulation layer 299 and/or resputter accumulation layer 298.

Figure 2G:
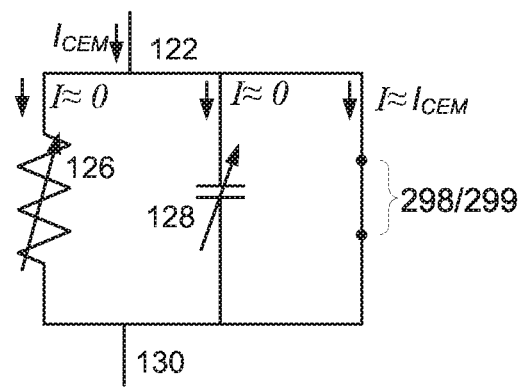
FIG. 2G is a schematic diagram of an equivalent circuit of a CEM film in which etching conductive overlay and/or exposed CEM of FIG. 2F may give rise to an electrical short between the conductive overlay and the conductive substrate.

FIG. 2G (embodiment 206) is a schematic diagram of an equivalent circuit in which resputter accumulation layer 299 and/or resputter accumulation layer 298 may give rise to an electrical short circuit between the conductive overlay and the conductive substrate. As indicated in FIG. 2G, under such conditions and in response to an applied voltage, an electrical current, such as $I_{CEM}$, may flow almost entirely through one or more of resputter accumulation layers 298 and 299. Accordingly, under an applied voltage, a low or negligible current may flow through the parallel combination of variable resistor 126 and variable capacitor 128.

Figure 3A:
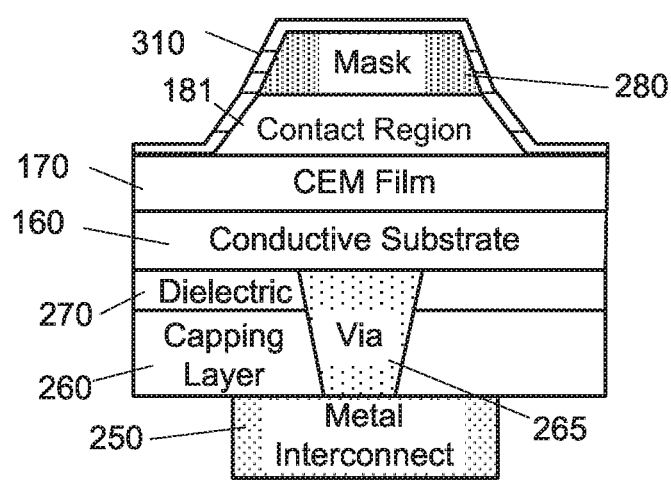
FIGS. 3A-3G illustrate a variation of the embodiments of the sub-processes of FIGS. 2A-2F illustrating subprocesses to insulate a sidewall portion of a conductive overlay.

FIGS. 3A-3G illustrate a variation of the embodiments of the sub-processes of FIGS. 2A-2F illustrating subprocesses to insulate a sidewall portion of a contact region 181. In FIG. 3A (embodiment 300), following a dry etch of a portion of conductive overlay 180 to form contact region 181 over CEM 170, an insulative layer, such as insulative layer 310, may be formed, such as by way of a deposition process, on or over exposed portions of mask 280, contact region 181, and CEM film 170. In particular embodiments, insulative layer 310 may be formed via physical vapor deposition, such as via a sputtering process, or may be formed via a chemical vapor deposition process, an atomic layer deposition process, and claimed subject matter is not limited in this respect. In certain embodiments, insulative layer 310 may comprise at least 50.0% silicon nitride (SiN), silicon oxynitride (SiON), silicon carbon nitride (SiCN), silicon carbide (SiC) or aluminum nitride (AlN), or any combination thereof, for example. Additionally, sealing layer 310 may comprise a material having a relative dielectric constant of, for example, between about 3.0 and about 10.0, for example. However, in other embodiments, sealing layer 310 may comprise a material having a dielectric constant within the range of about 2.0 to about 20.0, and claimed subject matter is not limited in this respect. Insulative layer 310 may comprise a thickness of, for example, between about 2.0 nm, and about 100.0 nm, although claimed subject matter is intended to embrace any useful thickness of insulative layer 310.

Figure 3B:
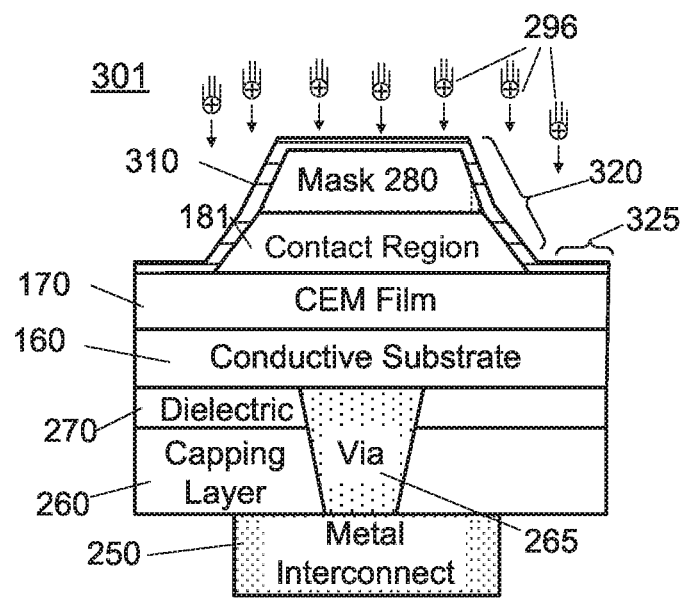

As indicated in FIG. 3B (embodiment 301), insulative layer 310 may be exposed to an etching process which may, at least in particular embodiments, correspond to reactive ion etch 296 to bring about removal of at least a portion of insulative layer 310. Reactive ion etch 296 may involve use of a chemically reactive plasma generated under a relatively low pressure (e.g. from about 0.0 Pa to about 10.0 kPa) by an electromagnetic field. Such generation of the chemically reactive plasma may operate to react with atomic or molecular components of insulative layer 310, thus giving rise to removal of portions of insulative layer 310.

Figure 3C:
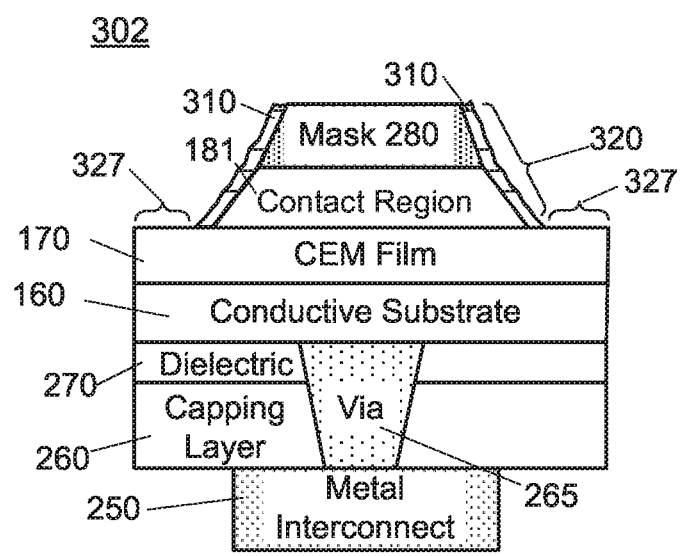

In other embodiments, reactive ion etch 296 may comprise an anisotropic (e.g., directional) etch, wherein insulative material deposited or formed on surfaces directly facing high-energy ions, such as surface 325, may be removed at a faster rate relative to the rate at which insulative material deposited on sidewall region 320 is removed. Thus, as shown in FIG. 3C (embodiment 302), removal of insulative material from surface 325 may bring about exposed portions 327 of CEM film 170 while at least a substantial portion of sidewall region 320 remains. In particular embodiments, although at least a portion of insulative layer 310 may be removed from sidewall region 320, for example, a significant portion of insulative layer 310 may remain, such as between about 1.0 nm and about 50.0 nm, for example, although claimed subject matter is not limited in this respect.

Figure 3D:
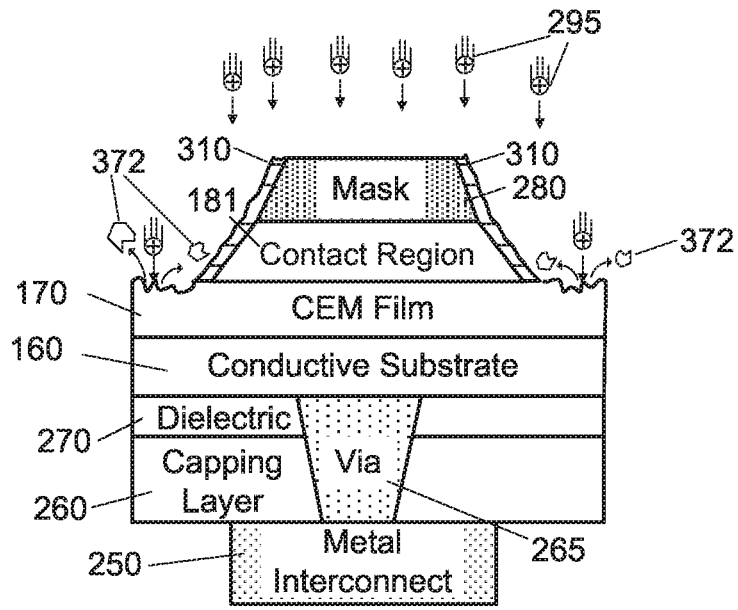
Figure 3E:
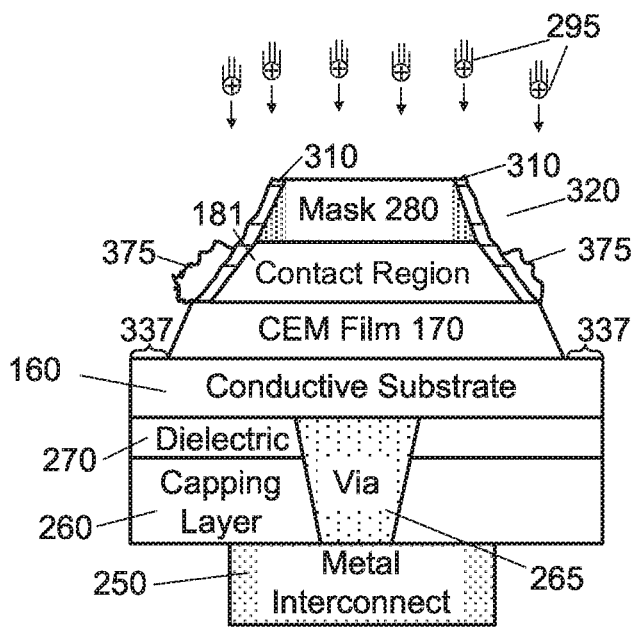

As indicated in FIG. 3D (embodiment 303), dry etch 295 may continue, so as to remove exposed portions of CEM film 170. Responsive to collisions between high-energy ions and exposed portions of CEM film 170, resputtered CEM droplets 372, which may comprise dislodged, unvaporized particles of CEM film 170, may be formed. As indicated in FIG. 3E, resputtered CEM droplets 372 may accumulate on or over sidewall region 320 of insulative layer 310. However, unlike accumulation layer 298 of FIGS. 2E and 2F, accumulation layer 375 does not connect to contact region 181. Rather, accumulation layer 375 may remain separated from contact region 181 by insulative layer 310, which forms an intervening layer between the accumulation layer and the contact region.

Figure 3F:
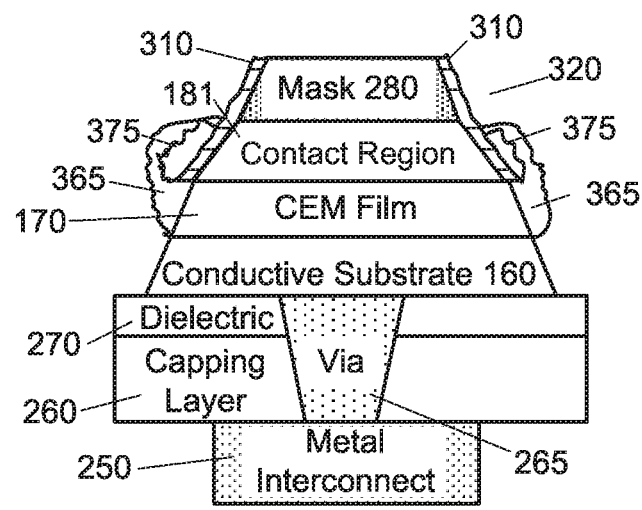

Dry etch 295, which may continue after substantially complete etching of portions of CEM film 170, may begin etching of exposed portions 337 of conductive substrate 160. Thus, similar to formation of resputtered CEM droplets 372 of FIG. 3D, dry etch 295 may give rise to resputtering of exposed portions of conductive substrate 160. Thus, as indicated in FIG. 3F, resputtered and unvaporized droplets of conductive substrate 160 may form on or over sidewall region 320 of insulative layer 310. However, again, at least partially responsive to a presence of insulative layer 310, accumulation layer 365 may remain at least electrically insulated from contact region 181.

Thus, it has been shown that a presence of insulative layer 310 may operate to separate and/or insulate contact region 181 from resputtered CEM, such as unvaporized particles of CEM dislodged from CEM film 170, as well as resputtered conductive substrate, such as from conductive substrate 160. Hence, unlike the equivalent circuit represented by FIG. 2G, resputtered CEM and/or resputtered conductive substrate may have, at most, negligible impact on current flow through a CEM film. Thus, an ability for CEM film 170 to desirably switch between a high-impedance/insulative state and a low-impedance conductive state may be preserved even after buildup of substantially conductive, metallic accumulation layers brought about by a dry etching processes. Insulative layer 310 may provide additional benefits, and claimed subject matter is not limited in this respect. Such additional benefits may include a reduced tendency toward charge trapping within metallic accumulation layers, which may increase parasitic capacitance of a switching device.

Figure 3G:
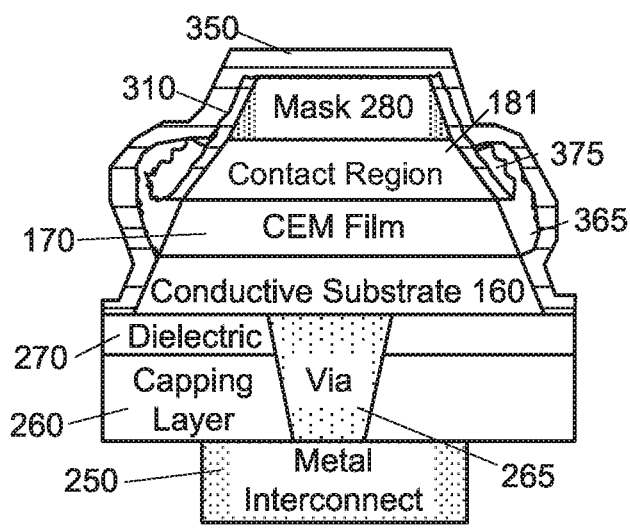

As indicated in FIG. 3G, following dry etching of contact region 181, CEM film 170, and conductive substrate 160, sealing layer 350 may be formed according to embodiment 306. In particular embodiments, sealing layer 350 may be formed via physical vapor deposition, such as via a sputtering process, or may be formed via a chemical vapor deposition process, an atomic layer deposition process, and claimed subject matter is not limited in this respect. In particular embodiments, sealing layer 350 may comprise a material similar to insulative layer 310 such as, for example, a material comprising a substantial percentage, such as at least 50.0%, for example, of silicon nitride (SiN), silicon carbide (SiC), silicon carbon nitride (SiCN), aluminum nitride (AlN), or any combination thereof. In particular embodiments, sealing layer 350 may operate to hermetically seal contact region 181, CEM film 170, and conductive substrate 160 from moisture and/or other contaminants, which may be introduced as a consequence of additional fabrication processes. Sealing layer 350 may additionally operate to restrict diffusion of dopants from CEM film 170, such as CO, and/or dopant components (e.g., unbonded carbon and/or unbonded oxygen). Sealing layer 310 may comprise a thickness of between about 10.0 Å and about 500.0 Å, although claimed subject matter is intended to embrace sealing layers of virtually any thickness, without limitation.

FIG. 4 is a flow diagram illustrating a process of fabricating and/or constructing a CEM switching device having contact region sidewall insulation according to embodiment 400. Example implementations, such as described in FIGS. 4-5, may include blocks in addition to those shown and described, fewer blocks, or blocks occurring in an order different than may be identified, or any combination thereof. With respect to the method of FIG. 4, the method may begin at block 405, which may comprise etching a portion of a conductive overlay formed over a CEM film to expose a portion of the CEM film and to form a sidewall region of a remaining portion of the conductive overlay. In particular embodiments, etching a portion of a conductive overlay formed over a CEM film may comprise anisotropic etching, in which an ion beam may be directed towards a conductive overlay, such as conductive overlay 180. In particular embodiments, anisotropic etching may be accomplished via bombarding the conductive overlay with high-energy ions, which collide with atoms and/or molecules of the conductive overlay. Responsive to such collisions, particles, such as individual atoms and/or molecules, may be vaporized and removed from the etching chamber.

In embodiments, block 405 may give rise to formation of a contact region, such as contact region 181, for example, of FIG. 2D, which may comprise sidewall region 320. The method of FIG. 4 may continue at block 410, which may comprise forming an insulative layer over the sidewall region. An insulative layer may be formed over the sidewall region via physical vapor deposition, which may comprise sputtering, for example, or may be formed via a chemical vapor deposition process or an atomic layer deposition process, and claimed subject matter is not limited in this respect. In embodiments, an insulative layer formed over a sidewall region, such as insulative layer 310, for example, may comprise a thickness of, for example, between about 2.0 nm, and about 100.0 nm, although claimed subject matter is intended to embrace any useful thickness of an insulative layer 310. An insulative layer formed at block 410 may comprise a substantial percentage, such as at least 50.0%, for example, of silicon nitride (SiN), silicon carbide (SiC), silicon carbon nitride (SiCN) or aluminum nitride (AlN), or any combination thereof. The method of FIG. 4 may continue at block 415, which may comprise removing an exposed portion of the CEM film, such as CEM film 170, while maintaining a portion of the CEM film disposed under the conductive overlay intact. In embodiments, removing of an exposed portion of a CEM film may comprise a process involving an ion beam directed toward a CEM film, wherein ions of the ion beam collide with atoms and/or molecules of the CEM film. In particular embodiments such collisions and ion beam with exposed portions of a CEM film may give rise to resputtered CEM droplets, for example, which may accumulate to form, for example, an accumulation layer, such as accumulation layer 375 of FIG. 3F. The method of FIG. 4 may continue with forming a sealing material, such as sealing layer 350, which may operate to hermetically seal at least portions of a CEM switch, such as a CEM switch formed from a contact region, a CEM film, a conductive substrate. In particular embodiments, a sealing layer may be formed via physical vapor deposition, such as via a sputtering process, or may be formed via a chemical vapor deposition process, an atomic layer deposition process, and claimed subject matter is not limited in this respect.

FIG. 5 is a flow diagram illustrating a process of fabricating and/or constructing a CEM switching device having contact region sidewall insulation according to embodiment 500. The method of FIG. 5 may begin at block 505, which may comprise forming a conductive contact region, such as contact region 181 of FIG. 3C, over a first portion of a film of CEM while maintaining an exposed second portion of the film of CEM, wherein the contact region comprises at least one sidewall. A conductive contact region may be formed as described with reference to the formation of conductive overlay 180 of FIG. 1B. Following of the conductive overlay, an etching process (e.g., utilizing an ion beam) may remove exposed portions of the conductive overlay, such as portions to the sides of mask 280 of FIG. 2D, for example. In an embodiment, a contact region may comprise a sidewall that accords with sidewall region 320 of FIG. 3C, and an exposed second portion of the film of CEM may correspond to exposed portions 327, for example, also of FIG. 3C.

The method of FIG. 5 may continue at block 510, which may comprise forming an insulative material on or over the at least one sidewall, wherein the insulative material operates to insulate the conductive contact region from resputtered CEM occurring during a dry etching process of the CEM film. An insulative material may be formed utilizing physical vapor deposition, such as via a sputtering process, or may be formed via a chemical vapor deposition process, or an atomic layer deposition process, and claimed subject matter is not limited in this respect. An insulative material formed at block 510 may correspond to, for example, insulative layer 310, which may comprise a substantial percentage, such as at least 50.0%, for example, of silicon nitride (SiN), silicon carbide (SiC), silicon carbon nitride (SiCN) or aluminum nitride (AlN), or any combination thereof. A layer of insulative material formed at block 510 may comprise a thickness of, for example, between about 2.0 nm, and about 100.0 nm, although claimed subject matter is intended to embrace any useful thickness of an insulative layer.

A plurality of CEM devices, such as those described herein, may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a switching device, comprising:
    etching a portion of a conductive overlay disposed over a correlated electron material (CEM) film to expose a portion of the CEM film and to expose a sidewall region of a remaining portion of the conductive overlay;
    forming an insulative layer on the exposed sidewall region; and
    removing a portion of the CEM film while maintaining intact a portion of the sidewall region disposed under the insulative layer, wherein:
    the CEM film is capable of switching between an insulative and/or high impedance state and a conductive and/or low impedance state responsive to a reversible back-donation process; and
    the CEM film comprises a metal and/or metal oxide and a dopant, the dopant having an atomic concentration in the CEM film of between about 0.1% and about 20.0%.

2. The method of claim 1, further comprising, following the removing of the portion of the CEM film, forming a sealing material over the CEM film to restrict diffusion into and out of the CEM film.

3. The method of claim 1, wherein the insulative layer comprises a relative dielectric constant of between 3.0 and 10.0.

4. The method of claim 1, wherein the insulative layer comprises at least 50.0% silicon nitride (SiN), silicon oxynitride (SiON), silicon carbon nitride (SiCN), silicon carbide (SiC) or aluminum nitride (AlN), or any combination thereof.

5. The method of claim 4, wherein the insulative layer comprises a thickness of between about 1.0 nm and about 50.0 nm.

6. The method of claim 1, wherein the removing of the exposed portion of the CEM film comprises using a dry etching process.

7. The method of claim 6, wherein the dry etching process comprises ion beam etching.

8. The method of claim 1, wherein the CEM film comprises an atomic concentration of at least about 85.0% of a material prone to resputtering responsive to exposure to a dry etching process conducted at a temperature of between about 10.0° C. to about 35.0° C.

9. The method of claim 1, further comprising, after removing the exposed portion of the CEM film, removing a conductive substrate disposed under the CEM film, the removing of the exposed portion of the CEM being limited to a portion of the CEM film outside of a region directly under a contact region of the conductive overlay.

10. A method of constructing a switching device, comprising:
    forming a conductive contact region over a first portion of a film of correlated electron material (CEM) while maintaining an exposed second portion of the film of CEM, the contact region having at least one sidewall; and forming an insulative material over the at least one sidewall, the insulative material to insulate the conductive contact region from resputtered CEM occurring during a dry etch process of the CEM film, wherein:

the CEM film is capable of switching between an insulative and/or high impedance state and a conductive and/or low impedance state responsive to a reversible back-donation process; and the CEM film comprises a metal and/or metal oxide and a dopant, the dopant having an atomic concentration in the CEM film of between about 0.1% and about 20.0%.

11. The method of claim 10, wherein the insulative material is capable of insulating the conductive contact region from resputtered conductive material under the CEM occurring during a dry etch process of the material under the CEM.

12. The method of claim 10, wherein the insulative material comprises at least 50.0% silicon nitride (SiN), silicon oxynitride (SiON), silicon carbon nitride (SiCN), silicon carbide (SiC) or aluminum nitride (AlN), or any combination thereof.

13. The method of claim 12, wherein the insulative material comprises a thickness of between about 1.0 nm and about 50.0 nm.

14. The method of claim 10, wherein the dry etching process comprises ion beam etching.

* * * * *